United States Patent [19]

Goser

[11] 3,933,529

[45] Jan. 20, 1976

[54] PROCESS FOR THE PRODUCTION OF A PAIR OF COMPLEMENTARY FIELD EFFECT TRANSISTORS

[75] Inventor: Karl Goser, Munich, Germany

[73] Assignee: Siemens Aktiengesellschaft, Berlin & Munich, Germany

[22] Filed: July 10, 1974

[21] Appl. No.: 487,153

[30] Foreign Application Priority Data

July 11, 1973    Germany............................ 2335333

[52] U.S. Cl. ................. 148/1.5; 148/175; 148/188; 357/91
[51] Int. Cl.². ..................................... H01L 21/265
[58] Field of Search ........ 148/1.5, 175, 188; 357/91

[56] References Cited

UNITED STATES PATENTS

| | | | |
|---|---|---|---|
| 3,436,817 | 4/1969 | Lane | 148/175 UX |
| 3,602,781 | 8/1971 | Hart | 148/175 X |
| 3,728,591 | 4/1973 | Sunshine | 148/175 X |
| 3,739,273 | 6/1973 | Hara | 148/175 UX |
| 3,745,072 | 7/1973 | Scott, Jr. | 148/175 |
| 3,749,614 | 7/1973 | Boleky et al. | 148/188 |
| 3,846,194 | 11/1974 | Dumin | 148/188 |

Primary Examiner—L. Dewayne Rutledge
Assistant Examiner—J. M. Davis
Attorney, Agent, or Firm—Hill, Gross, Simpson, Van Santen, Steadman, Chiara & Simpson

[57] ABSTRACT

A process for the production of a pair of complementary field effect transistors which have very short channel lengths. A lightly doped semiconductor layer is deposited on an electrically insulating substrate. A gate insulator layer is applied onto which first and second gate electrodes are formed for the two transistors. A masking oxide layer is applied to the exposed surface regions of the gate insulating layer and the gate electrodes. An opening is etched into the masking layer and gate insulator layer lying adjacent each gate electrode. Charge carriers of first and second types are diffused through the respective openings into the region of the semiconductor layer lying below to dope the same. This doping extends partially into the semiconductor region lying beneath a portion of the respective gate electrodes. All parts of the gate insulator layer except those parts lying beneath the gate electrodes are removed. Charge carriers of the second and first type are diffused into the semiconductor layer on opposite sides of the first and second gate electrodes, respectively, while leaving a portion of the first and second doped regions unchanged beneath the first and second gate electrodes. The doped regions of the semiconductor layer on opposite sides of the first and second gate electrodes provide the source and drain regions of the first and second field effect transistors, respectively.

6 Claims, 9 Drawing Figures

PROCESS FOR THE PRODUCTION OF A PAIR OF COMPLEMENTARY FIELD EFFECT TRANSISTORS

BRIEF SUMMARY OF THE INVENTION

The present invention provides a novel process for producing complementary MOS circuits, the power loss of which is low and the switching times of which are very short. Thus, the product of the delay time and the power loss of such circuits is very favorable. Complementary MOS field effect transistors produced by the process in accordance with the invention are well adapted for use in digital circuits and particularly for counters and storage circuits. With the aid of a double diffusion technique or with one diffusion step and one implantation step, it is possible to produce transistors having very short channel lengths such, for example, as approximately one micron. As the switching times of the MOS transistors are inversely proportional to their channel lengths squared, this diffusion technique is particularly well suited for circuits requiring very short switching time. With ion implantation, silicon-gate technique or refractory metal technique, it is possible to substantially reduce the capacitance of the circuits by avoiding parasitic capacitances, which leads to a reduction in switching times.

Advantageously, the power loss which occurs as a result of the recharging of the parasitic capacitances, can be further reduced with the aid of the circuits produced by the process of the invention.

DESCRIPTION OF PREFERRED EMBODIMENTS

Figure 1:
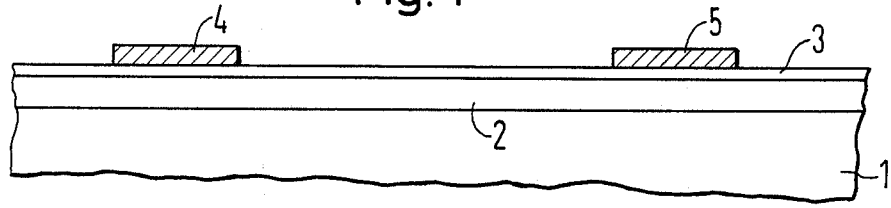
FIGS. 1 to 5 schematically illustrate the individual processing steps of the invention for the production of complementary MOS field effect transistors by two diffusion steps and the self adjusting technique.

As schematically illustrated in FIG. 1, a monocrystalline semiconductor layer 2 is applied to an electrically insulating substrate 1, which preferably consists of spinel or sapphire. This semiconductor layer is a weakly doped layer, preferably a $p^-$-conducting or an $n^-$-conducting silicon layer. This semiconductor layer is so weakly p- or n-doped that in the finished arrangement, the regions of this layer contained in the individual field effect transistors, will during the operation of the field effect transistors, by voltages connected to the latter, be entirely cleared of moving charge carriers. The gate insulator layer 3, which preferably consists of silicon dioxide ($SiO_2$) and/or silicon nitride ($Si_3N_4$) is deposited on the silicon layer 2. Now gate electrodes and conductor paths are applied to the gate insulator layer 3. The latter consist, for example, of silicon or of a refractory metal, such as molybdenum.

Figure 2:
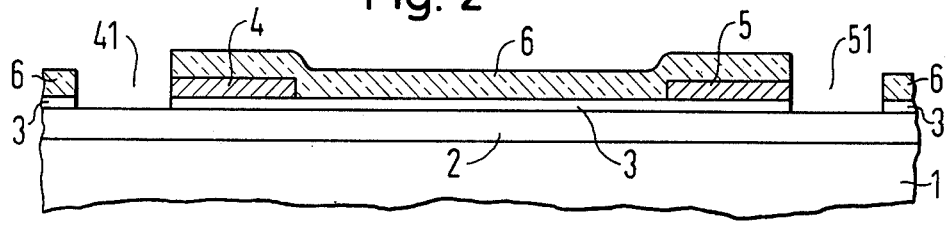
Figure 3:
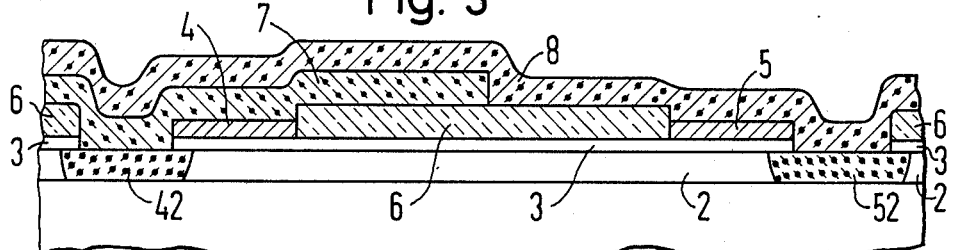

Two gate electrodes 4 and 5 are formed on the gate insulator layer 3. These gate electrodes will be the gate electrodes for the two field effect transistors, one of the electrodes being for the field effect transistor of one conductivity type and the other gate electrode being for the other field effect transistor of the opposite conductivity type. As shown in FIG. 2, a masking oxide 6 is now grown on the arrangement shown in FIG. 1. This masking oxide 6 preferably is silicon dioxide. Openings 41 and 51 are then formed through the masking oxide 6 and the gate insulator layer 3. It will be noted that the openings 41 and 51 are immediately adjacent one edge of the electrodes 4 and 5 respectively.

In a further processing step, an n-doped oxide 7 is applied above the p-channel transistor, for example, above the transistor with the gate electrode 4, and in the opening 41. A p-doped oxide 8 is applied above the n-channel transistor, for example, above the transistor with the gate electrode 5. The doped oxides are preferably doped silicon dioxide. In a first diffusion step, which now follows, the diffused regions 42 and the likewise diffused regions 52 are formed in the silicon layer 2. Here the region 42 is p-doped and the further region 52 is n-doped. The regions 42 and the further regions 52 also in each case extend partially into the regions of the semiconductor layer 2 which lies beneath the gate electrodes 4 and 5.

Figure 4:
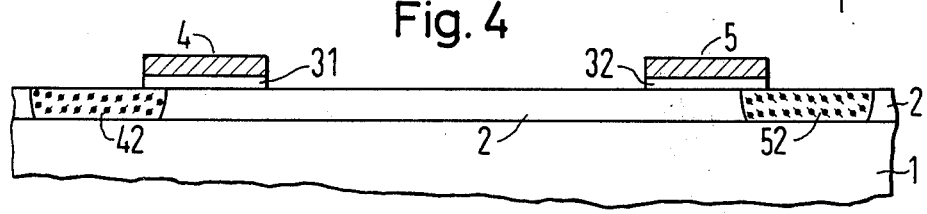

In further processing steps, the masking oxide layers 8 and 7 and the masking oxide layer 6 are now removed, forming an arrangement such as that schematically illustrated in FIG. 4. The gate insulators arranged below the gate electrodes 4 and 5 are now specifically identified as 31 and 32.

Figure 5:
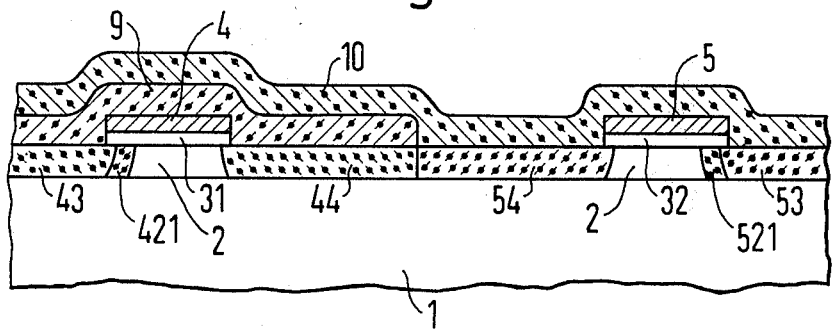

As represented in FIG. 5, in further processing steps, a p-doped oxide is applied above the p-channel transistor which includes gate electrode 4 and above the regions of the semiconductor layer 2 adjoining this transistor, and an n-doped oxide is applied above the n-channel transistor, which includes gate electrode 5 and above the regions of the semiconductor layer 2 adjoining this transistor (FIG. 4). In the second diffusion step, which now follows, in the p-channel transistor, the n-doped regions 44 and the portion 43 in the originally p-doped region 42 are formed. Here the portion 43 does not extend as far beneath the gate insulator 31 as the original region 52, so that the p-doped region 421 adjoins the n-doped region. This region 421 represents the p-channel of the p-channel transistor. In the same diffusion step, in the n-channel transistor with the gate electrode 5 are formed the p-doped further regions 54 and in a further portion of the original n-doped further region 52 is formed the p-doped region 53. Here the region 53 does not extend as far beneath the gate electrode 32 as the originally p-doped region 52. Therefore, the zone 521 remains, next to the n-doped portion 53, beneath the gate insulator 32. This zone is n-doped and represents the n-channel of the n-channel field effect transistor.

Figure 6:
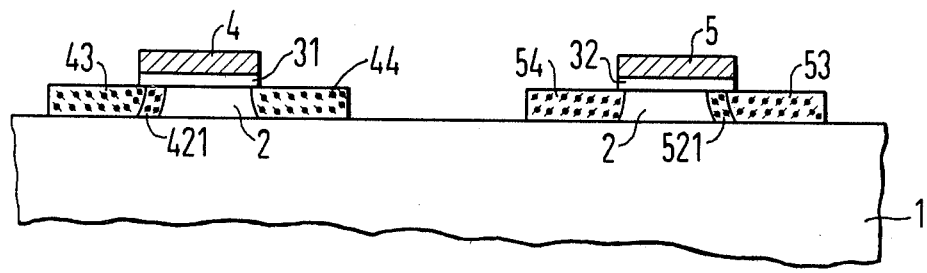
FIGS. 6 to 9 show a process for the production of complementary MOS field effect transistors with one diffusion step and one ion implantation step.

In further processing steps, the doped oxide layers 9 and 10 are removed, as well as parts of the semiconductor layer 2, as well as portions above the portion 43, above the region 44, above the further region 54 and above the further portion 53 leaving the arrangement schematically illustrated in FIG. 6. Now a p-channel transistor (the transistor with the gate electrode 4) and an n-channel transistor (the transistor with the gate electrode 5) are arranged on the insulating substrate 1, said transistors being electrically insulated from one another. The portion 43 and the region 44 represent the source- and drain zones of the p-channel field effect transistor and the further portion 53 and the region 54 represent the source- and drain zones of the n-channel field effect transistor.

In further processing steps which are not illustrated in the Figures, the source- and the drain- zones of the field effect transistors and the gate electrodes of these transistors are provided with aluminum conductor paths and contacted.

The source- and drain zones of the field effect transistors can also be produced by ion implantation instead of by the above described second diffusion step.

Figure 7:
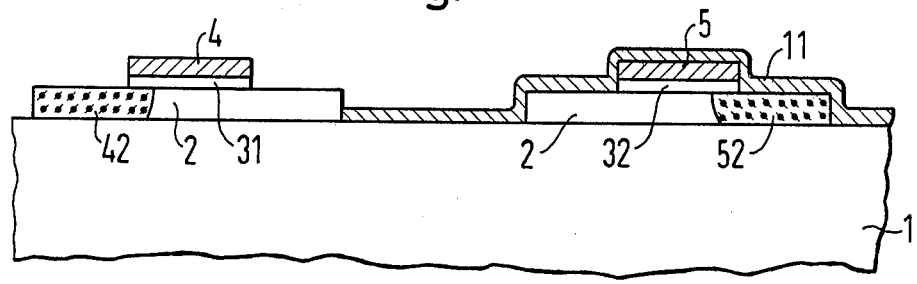

For this purpose, in the arrangement shown in FIG. 4, parts of the semiconductor layer 2 and of the region 42, and of the further region 52 are removed, producing the arrangement shown in FIG. 7. As can also be seen from FIG. 7, an aluminum layer 11 is now applied to one of the field effect transistors, for example, to the n-channel field effect transistor. The function of the aluminum layer 11 is to protect the surface regions lying beneath it from ion implantation. Now, in an ion implantation process, positive ions are implanted into the exposed zones, i.e., the zones of the p-channel transistor which are not covered by the gate insulator layer 31 and the gate electrode 4.

Figure 8:
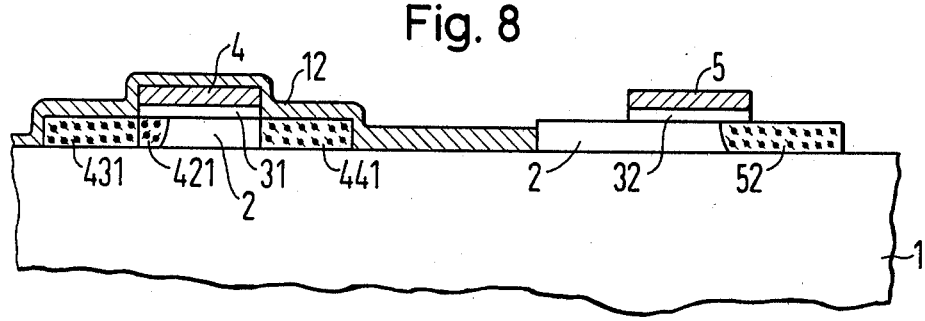

As illustrated in FIG. 8, in this way are formed the highly doped p-conducting zones 431 and 441. As also shown in FIG. 8, in a further processing step, the aluminum layer 11 which was applied above the n-channel field effect transistor, is now removed. In a following processing step, preferably an aluminum layer 12 is applied to the p-channel field effect transistor. This layer has the function of protecting the p-channel field effect transistor from further ion implantation.

In a second ion implantation step, the highly doped n-conducting zones 541 and 531 of the n-channel field effect transistor are produced by ion implantation. This is exemplified in FIG. 9.

Figure 9:
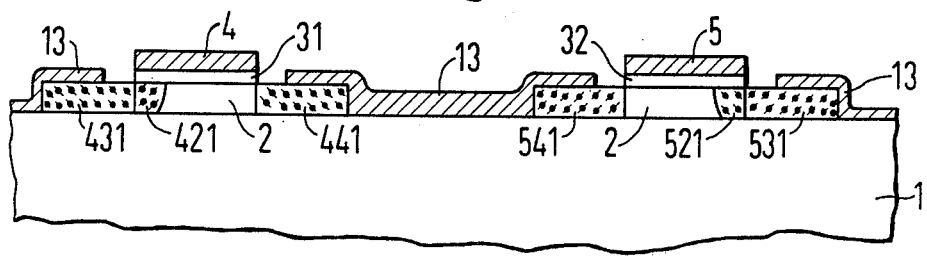

As a result of the two ion implantation steps, a p-channel field effect transistor and an n-channel field effect transistor have been formed on the substrate 1. Here the highly doped zones 431 and 441 represent the drain- and source zones of the p-channel field effect transistor. The portion 521 represents the p-channel of the p-channel field effect transistor. The same applies to the zones 541 and 531 and to the portion 521 of the n-channel field effect transistor. As also shown in FIG. 9, in known processing steps, the zones 431, 441, 541 and 531 are provided with conductor paths 13, preferably aluminum conductor paths and are contacted.

The transistors of the p- and n-type which have been produced by these two processes, by double diffusion or simple diffusion with subsequent implantation processes, possess a short channel length. Also, on account of the self-adjusting technique, there is no overlapping of the gate electrodes 4 and 5 with the highly doped zones 431, 441, and 541 and 531.

A special feature of the process in accordance with the invention consists in the fact that as semiconductor layer 2, which serves as a starting layer for the production of the transistors in the complementary-MOS-technique, only one p⁻-conducting or one n⁻-conducting layer are used. In the previous techniques, a p⁻-conducting layer was employed for the production of a p-channel MOS-transistor and an n⁻-conducting layer was employed for the production of an n-channel MOS-transistor. This fact results in a simplification. This simplification is possible since the weakly doped layer sections are entirely cleared of moving charge carriers and therefore in the case of both types, the charge carriers safely cross through the weakly doped layer section on account of the electric fields prevailing in these depletion zones.

It will be apparent to those skilled in the art that many modifications and variations may be effected without departing from the spirit and scope of the novel concepts of the present invention.

I claim as my invention:

1. A process for the production of a pair of complementary field effect transistors on a substrate of insulating material which comprises:
   a. forming a low doped monocrystalline semiconductor layer on the insulating substrate;
   b. forming a gate insulator layer on said semiconductor layer;
   c. forming first and second gate electrodes on said insulating layer;
   d. forming an oxide masking layer over the exposed surface regions of said semiconductor layer and over said electrodes;
   e. etching first and second openings through said masking layer and through said gate insulating layer, said first opening adjoining one side of said first gate electrode and said second opening adjoining one side of said second gate electrode;
   f. effecting a first doping step comprising
      i. diffusing charge carriers of a first type into a first region of said semiconductor layer lying beneath said first opening and beneath a portion of said first gate electrode, and
      ii. diffusing charge carriers of a second type into a second region of said semiconductor layer lying beneath said second opening and beneath a portion of said second gate electrode;
   g. removing all parts of said gate insulating layer apart from the parts located below said gate electrodes; and
   h. effecting a second doping step comprising
      i. doping with charge carriers of the second type the semiconductor layer on opposite sides of said first gate electrode while leaving the portion of said first region unchanged below said first gate electrode, and
      ii. doping with charge carriers of the first type the semiconductor layer on opposite sides of said second gate electrode while leaving the portion of said second region unchanged below said second gate electrode;
   whereby the doped semiconductor regions on opposite sides of said first gate electrode provide the source and drain regions of a first Metal Oxide Silicon field effect transistor, and the doped regions on opposite sides of said second gate electrode provide the source and drain regions of a second Metal Oxide Silicon field effect transistor.

2. A process of producing field effect transistors of claim 1 in which said second doping step comprises a diffusion of charge carriers of the first and second type.

3. A process as claimed in claim 2, in which in the first doping process, a doped oxide of one type is applied to said first field effect transistor and into said first opening, and a doped oxide of the opposite type is applied to said second field effect transistor and into said second opening, wherein said oxides being doped with opposite types of charge carriers, regions of said semiconductor layer below said openings are produced in one diffusion process.

4. A process as claimed in claim 2, in which in the second doping process a doped oxide layer of the second type is applied to said first field effect transistor and to the adjoining regions of the semiconductor layer and a doped oxide layer of the first type is applied to said second field effect transistor and to the adjoining regions of the semiconductor layer.

5. A process as claimed in claim 1 in which the said second doping step comprises ion implantation substeps providing separating the individual transistors from one another by etching the semiconductor layer, thereafter covering said second transistor with a metal layer which acts as a protection from ion implantation while an ion implantation step is carried out in said first transistor, the implanted charge carriers being of the opposite type to the charge carriers introduced during the earlier diffusion process into the first field effect transistor, then removing said first metal layer, and forming a metal layer over said first transistor which serves as a protection from ion implantation in said first transistor while implanting ions into said second field effect transistor, said ions being of the opposite type to the charge carriers introduced into said second field effect transistor in the earlier diffusion process.

6. A process as claimed in claim 5, in which the metal layers which serve as a protection from implantation consist of aluminum.

* * * * *